United States Patent [19]

Hung et al.

[11] Patent Number: 5,677,572
[45] Date of Patent: Oct. 14, 1997

[54] BILAYER ELECTRODE ON A N-TYPE SEMICONDUCTOR

[75] Inventors: Liang-Sun Hung, Webster; Ching Wan Tang, Rochester, both of N.Y.

[73] Assignee: Eastman Kodak Company, Rochester, N.Y.

[21] Appl. No.: 681,565

[22] Filed: Jul. 29, 1996

[51] Int. Cl.⁶ .................... H01L 23/48; H01L 23/52; H01L 29/40
[52] U.S. Cl. .................... 257/750; 257/741; 257/744
[58] Field of Search .................... 257/750, 741, 257/743, 744, 745

[56] References Cited

U.S. PATENT DOCUMENTS

| | | |
|---|---|---|
| 4,971,948 | 11/1990 | Dam et al. . |
| 5,063,183 | 11/1991 | Taniguchi et al. . |
| 5,075,796 | 12/1991 | Schildkraut et al. . |
| 5,157,541 | 10/1992 | Schildkraut et al. . |
| 5,262,668 | 11/1993 | Tu et al. . |
| 5,492,776 | 2/1996 | Paz-Pujalt et al. . |
| 5,519,234 | 5/1996 | Paz de Araujo et al. . |
| 5,525,380 | 6/1996 | Paz-Pujalt et al. . |

*Primary Examiner*—Mahshid D. Saadat
*Assistant Examiner*—S. V. Clark
*Attorney, Agent, or Firm*—Raymond L. Owens

[57] ABSTRACT

An electrode in contact with a n-type semiconductor for use in an electronic or optoelectronic device is disclosed. The electrode includes a non-conducting layer contacting the semiconductor; a conductive layer contacting the non-conducting layer, and the materials and the thickness of the non-conducting layer being selected so that the bilayer forms a low-resistance contact to the semiconductor, the bilayer providing stability against atmospheric corrosion.

14 Claims, 2 Drawing Sheets

BILAYER ELECTRODE ON A N-TYPE SEMICONDUCTOR

CROSS REFERENCE TO RELATED APPLICATION

Reference is made to commonly assigned U.S. Ser. No. 08/681,680, filed concurrently and entitled "Bilayer Electron-Injecting Electrode For Use in an Electroluminescent Device" to Hung et at, and commonly-assigned U.S. Ser. No. 08/681,734, filed concurrently and entitled "Transparent Electron-Injecting Electrode For Use in an Electroluminescent Device" by Hung et al, the disclosures of which are incorporated by reference.

1. Field of the Invention

The present invention relates to bilayer electrodes, which are effective for use with n-type semiconductors.

2. Background of the Invention

Metal-semiconductor contacts are essential for the fabrication of electronic or optoelectronic devices including Si-integrated circuits, solar cells, and electroluminescent devices. For instance, a low-resistance contact to a solar cell is an important part of the device, since any significant contact resistance adds to the series resistance and reduces the power output. Likewise, a low-resistance contact would reduce the power consumption of an electroluminescent device.

When a metal is used as an electrode, making intimate contact with a n-type semiconductor, the potential barrier $\phi_{Bn}$ for the flow of electrons is approximately equal to the energy difference between the metal work function $\phi_m$ and the semiconductor electron affinity $x_s$. The description holds best to ionic semiconductors, including inorganic materials such as ZnS or CdS and organic materials such as Alq and PPV. For covalent semiconductors such as Si, Ge, and GaAs the description given above needs to be modified to account for interface states. Still a moderate dependence of $\phi_{Bn}$ on $\phi_m$ was found for the metal-semiconductor contacts. The barrier height is an important parameter, because small differences of the barrier height lead to order of magnitude differences in barrier resistance. In order to reduce the barrier height to a n-type semiconductor it is desirable to use metals with a low work function, such as lithium, sodium, potassium, rubidium, cesium, magnesium, calcium, strontium, and barium. However, these metals are chemically reactive and are susceptible to atmospheric oxidation and corrosion.

In this invention, a bilayer is proposed to form a low barrier contact to n-type semiconductors. The bilayer is composed of a thin non-conducting layer and a conductive layer. The non-conducting layer has a strong dipole character, thus altering space charges built up near the metal-semiconductor interface and lowering the barrier height.

SUMMARY OF THE INVENTION

It is an object of the present invention to provide a contact to n-type semiconductors with a low barrier height.

This object is achieved by a bilayer electrode in contact with a n-type semiconductor, comprising:

a) a thin non-conducting layer contacting the n-type semiconductor, the layer having a strong dipole character such as alkali or alkaline earth metal fluorides or oxides;

b) a conductive layer contacting the non-conducting layer, the layer having a good stability against atmospheric oxidation; and c) the thickness of the non-conducting layer being selected so that the bilayer forms a contact with a low barrier height, the bilayer providing stability against atmospheric corrosion.

ADVANTAGES OF THE INVENTION

Metals with a low work function such as lithium, sodium, potassium, rubidium, and cesium is an ideal candidate to form low-resistance contacts to n-type semiconductors. However, they are extremely sensitive to oxidation and show poor corrosion resistance. In contrast, alkali or alkaline earth metal fluorides or oxides are quite stable, and the reaction with most of the materials is thermodynamically inhibited.

Alkali and alkaline earth metal fluorides or oxides are insulating. For instance, lithium fluoride is a superior insulating material because it has the highest bandgap energy of 12 eV among oxides and fluorides. It is disclosed in this invention, however, that lithium fluoride in the form of ultra thin film (tens of angstroms) backed by a suitable metal layer is an effective electron injector for organic electroluminescent devices.

DETAILED DESCRIPTION OF THE INVENTION

Figure 1:
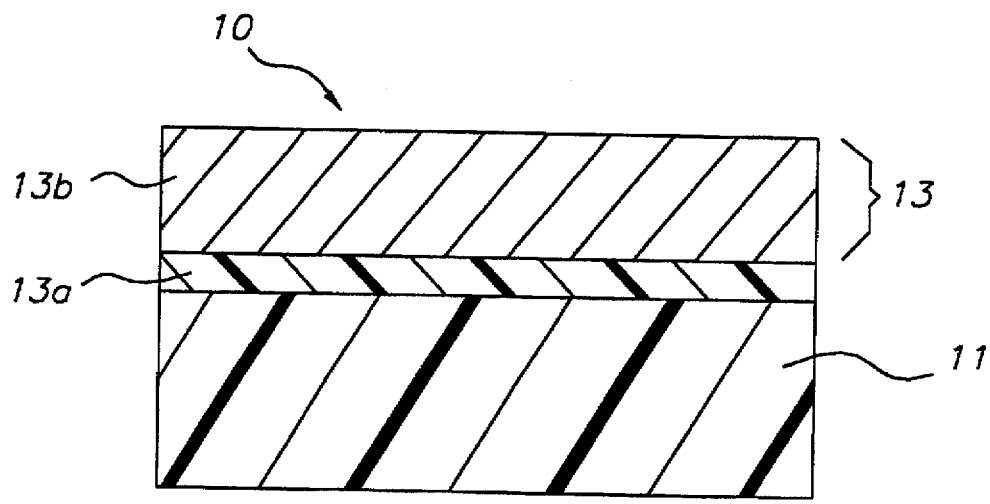
FIG. 1 is a schematic diagram of an embodiment of the bilayer electrode contacting a n-type semiconductor.

Referring to FIG. 1, a structure 10 of the invention has, in order, a substrate 11 and a bilayer electrode 13 contacting the substrate. The electrode includes a non-conducting layer 13a and a conductive layer 13b Substrate 11 is a n-type semiconductor. It is either amorphous or crystalline. The semiconductor shows a strong or moderate dependence of $\phi_{Bn}$ on $\phi_m$ when a metal is in intimate contact with the substrate. The semiconductors include inorganic materials such as CdS, GaS, ZnS, CdSe, CaSe, ZnSe, CdTe, GaTe, SiC, and Si and organic materials such as poly(paraphenylene vinylene) (PPV), PPV copolymers and derivatives, polyaniline, poly(3-alkylthiophene), poly(3-octylthiophene), poly(paraphenylene), and Alq.

Electrode 13 forms a contact to substrate 11, showing a low barrier resistance and a good stability against atmospheric oxidation. Electrode 13 includes a thin non-conducting layer 13a and a thick conductive layer 13b.

Examples 1 and 2 described in this invention indicate that the non-conducting layer can be selected from the group of alkali or alkaline earth fluorides or oxides. The alkali fluoride includes lithium fluoride, sodium fluoride, potassium fluoride, rubidium fluoride, or cesium fluoride, and the alkali oxide includes lithium oxide, sodium oxide, potassium oxide, rubidium oxide, or cesium oxide. The alkaline earth fluoride includes magnesium fluoride, calcium fluoride, strontium fluoride, or barium fluoride, and the alkaline earth oxide includes magnesium oxide, calcium oxide, strontium oxide, or barium oxide.

The conductive layer can be selected from the group of elemental metal, metal alloys, nitrides such as GaN, sulfides such as ZnS, and oxides. The suitable metal oxides include indium-tin-oxide, aluminum- or indium-doped zinc oxide, tin oxide, magnesium-indium-oxide, nickel-tungsten oxide, and cadmium-tin-oxide.

In accordance with this invention, the thickness of the non-conducting layer should be from 0.3 to 5.0 nm, preferably 0.5 to 1.0 nm. When the thickness is below 0.3 nm, the fluoride layer can not fully cover its underlying organic layer. When the thickness is above 5.0 nm, the applied current through the bilayer into the organic layer would be substantially reduced. A useful range of the conductive layer thickness is from 10 to 1000 nm, preferably 50–500 nm. Electrode 13 can be deposited by many conventional means, such as evaporation, sputtering, laser ablation, and chemical vapor deposition.

Figure 2:
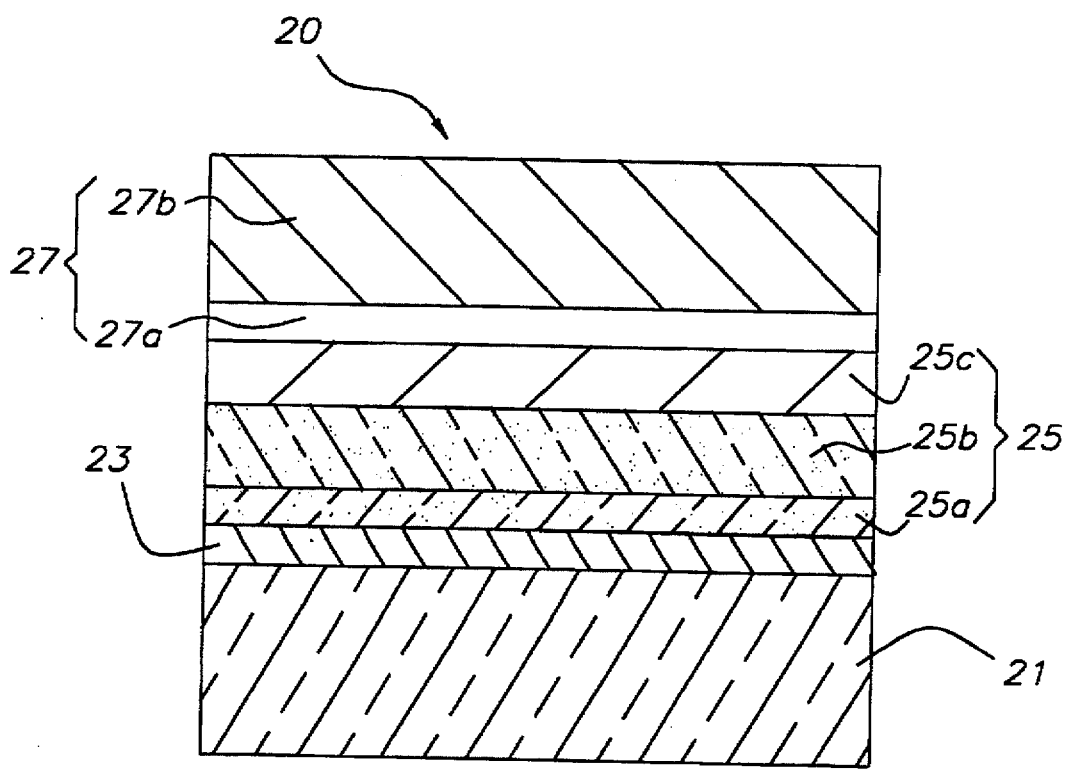
FIG. 2 is a schematic diagram of an organic electroluminescent device used as a test structure in this disclosure.

Referring to FIG. 2, an electroluminescence device 20 has, in order, a glass substrate 21, an ITO anode 23, an organic layer structure 25, an electron-injecting electrode 27. The organic multi-layer structure includes a CuPc adhesive layer 25a, a p-type semiconductor NPB layer 25b, and a n-type-semiconductor Alq layer 25c. The top electrode includes an non-conducting layer 27a and a conductive layer 27b.

The following examples are presented for a further understanding of the invention.

EXAMPLE 1

An organic EL device satisfying the requirements of the invention was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer;

e) a 0.5 nm-thick lithium fluoride layer was deposited on the Alq layer;

f) a 120 nm-thick aluminum layer was deposited on the LiF layer.

All the materials were prepared by thermal evaporation from tantalum boats.

EXAMPLE 2

The same materials and processing procedures were employed as described in Example 1, except that the lithium fluoride layer was replaced by a magnesium fluoride, a calcium fluoride, a lithium oxide, or a magnesium oxide layer.

EXAMPLE 3

The same materials and processing procedures were employed as described in Example 1, except that the lithium fluoride layer was replaced by a germanium di-oxide or a silicon diooxide layer.

EXAMPLE 4

An organic EL device was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer;

e) a 120 nm-thick aluminum layer or a 200 nm-thick $Mg_{0.9}Ag_{0.1}$ layer was deposited on the Alq layer.

All the materials were prepared by thermal evaporation from tantalum boats.

Figure 3:
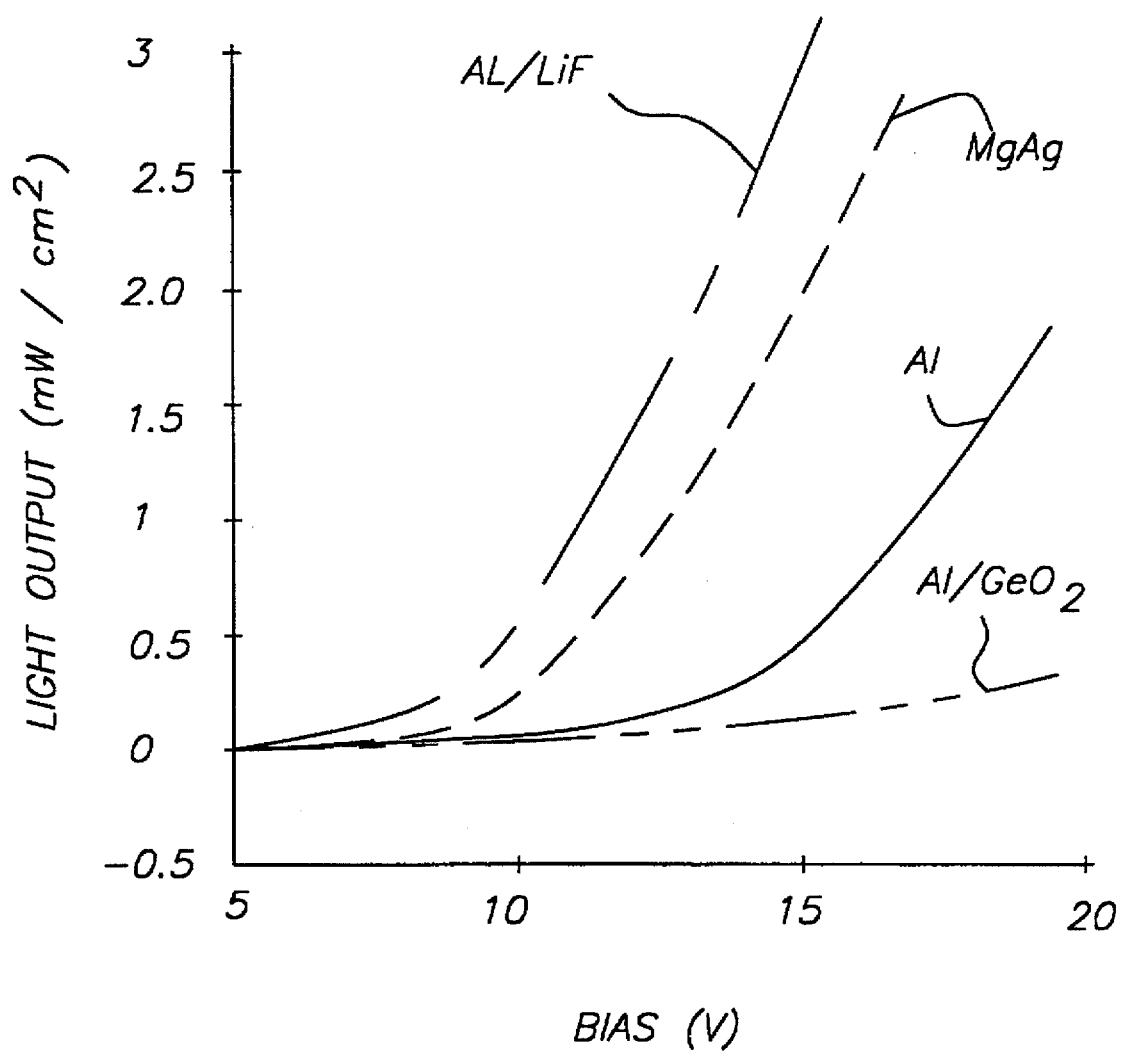
FIG. 3 is a plot of device characteristics (light output versus operating voltage) for the test structure.

All the devices were evaluated with a positive potential applied to the anode and the cathode attached to ground to determine the characteristics of voltage-current and voltage-light emission, and the results are shown in FIG. 3. The light output is plotted as a function of operating voltage for Al/LiF, MgAg, Al, or $Al/GeO_2$. The device with an aluminum cathode requires a drive voltage of approximately 16.5 V to generate a light output of 1 $mW/cm^2$, which is substantially higher than that of the device with a MgAg cathode. Occurring with the higher drive voltage is a lower EL efficiency. The difference is attributed to a higher work function of Al (4.3 eV) than that of Mg (3.7 eV). It is surprising, however, that the device performance with an Al cathode can be dramatically improved by interposing an one- to two- monolayer of LiF between Alq and Al. For instance, with a bilayer cathode (Al/LiF) the drive voltage is reduced to 11.2 V, and the EL efficiency is increased correspondingly. The results are better than that with a MgAg cathode. Similar results were obtained when using $Li_2O$, MgO, $CaF_2$, and $MgF_2$ to replace LiF as the intermediate insulating layer.

The results clearly indicate that interpolating a non-conducting layer such as LiF and MgO between Alq and Al significantly reduces the barrier height for electron transport. It is of importance to note that the replacement of $Al/GeO_2$ for Al yielded poor device characteristics with a 0.5 $mW/cm^2$ light output at a bias of 20 V. It further confirms that the improvement is related to a high dipole character of alkali or alkaline earth metal fluorides or oxides.

The invention has been described in detail with particular reference to certain preferred embodiments thereof, but it will be understood that variations and modifications can be effected within the spirit and scope of the invention.

| Parts List | |
|---|---|
| 10 | structure |
| 11 | substrate |
| 13 | bilayer |
| 13a | non-conducting layer |
| 13b | conductive layer |
| 20 | electroluminescence device |
| 21 | glass substrate |
| 23 | ITO anode |
| 25 | organic layer structure |
| 25 | adhesive layer |
| 25b | NPB layer |
| 25c | Alq layer |
| 27 | electron-injecting electrode |
| 27a | non-conducting layer |
| 27b | conductive layer |

We claim:

1. A bilayer electrode in contact with a n-type semiconductor, comprising:

a) a thin non-conducting layer contacting the n-type semiconductor, the layer having a strong dipole character such as alkali or alkaline earth metal fluorides or oxides;

b) a conductive layer contacting the non-conducting layer, the layer having a good stability against atmospheric oxidation; and c) the thickness of the non-conducting layer being selected so that the bilayer forms a contact with a low barrier height, the bilayer providing stability against atmospheric corrosion.

2. The electrode of claim 1 wherein the n-type semiconductor is selected from an inorganic or organic semiconductor.

3. The electrode of claim 2 wherein inorganic semiconductor includes CdS, GaS, ZnS, CdSe, GaSe, ZnSe, CdTe, GaTe, SiC, and Si.

4. The electrode of claim 2 wherein the organic semiconductor includes poly(paraphenylene vinylene) (PPV), PPV copolymers and derivatives, polyaniline, poly(3-alkylthiophene), poly(3-octylthiophene), poly(paraphenylene), and Alq.

5. The electrode of claim 1 wherein the thickness of the non-conductive layer is in the range of 0.3 to 5.0 nm.

6. The electrode of claim 1 wherein the non-conductive materials have a strong dipole character.

7. The electrode of claim 6 wherein said the non-conductive layer is selected from an alkali fluoride, an alkaline earth fluoride, an alkali oxide, or an alkaline earth oxide.

8. The electrode of claim 7 wherein said alkali fluoride includes lithium fluoride, sodium fluoride, potassium fluoride, rubidium fluoride, or cesium fluoride.

9. The electrode of claim 7 wherein said alkaline earth fluoride includes magnesium fluoride, calcium fluoride, strontium fluoride, or barium fluoride.

10. The electrode of claim 7 wherein said alkali oxide includes lithium oxide, sodium oxide, potassium oxide, rubidium oxide, or cesium oxide.

11. The electrode of claim 7 wherein said alkaline earth oxide includes magnesium oxide, calcium oxide, strontium oxide, or barium oxide.

12. The electrode of claim 1 wherein said conductive layer can be selected from the group consisting of elemental metal, metal alloys, oxides, nitrides, and sulfides.

13. The electrode of claim 12 wherein suitable metal oxides include indium-tin-oxide, aluminum- or indium-doped zinc oxide, tin oxide, magnesium-indium-oxide, nickel-tungsten oxide, and cadmium-tin-oxide.

14. The electrode of claim 12 wherein the nitride is GaN and the sulfide is ZnS.

* * * * *